United States Patent [19]

Funston et al.

[11] 4,151,481
[45] Apr. 24, 1979

[54] DIGITAL GAIN CONTROL SYSTEM

[75] Inventors: David L. Funston, Batavia; Zachariah H. Milburn, Jr., Amherst, both of N.Y.

[73] Assignee: GTE Sylvania Incorporated, Stamford, Conn.

[21] Appl. No.: 863,151

[22] Filed: Dec. 22, 1977

[51] Int. Cl.² .............................................. H03G 3/10
[52] U.S. Cl. ....................................... 330/279; 330/86; 330/129
[58] Field of Search ................... 330/86, 127, 129, 279

[56] References Cited
U.S. PATENT DOCUMENTS
3,961,281   6/1976   Woolling, Jr. .................. 330/129

Primary Examiner—Lawrence J. Dahl
Attorney, Agent, or Firm—John A. Odozynski

[57] ABSTRACT

A digital gain control system is disclosed. A clock oscillator drives a counter which in turn provides an output to a D/A converter. The analog output of the converter is used to develop a signal for controlling the gain of a gain-controlled amplifier. In order to compensate for the nonlinear gain versus control current characteristic of the amplifier, additional circuitry is employed so that the initial increment in control current, that is, the increment that occurs as the counter goes from the 0000 to the 0001 state, is significantly greater than the remaining increments. In conjunction with volume control circuitry for audio amplifiers, this circuitry assures a muted condition in the 0000 state, and an audio output corresponding to at least the minimum discernible level in the 0001 state.

16 Claims, 3 Drawing Figures

DIGITAL GAIN CONTROL SYSTEM

BACKGROUND OF THE INVENTION

Remote control is a popular feature in television receivers. One of the functions often the subject of remote control is the audio output of the receiver. In conventional all-electronic remote systems the audio volume is varied by varying the gain of a DC gain-controlled audio amplifier. In digital gain control systems this can be accomplished by transmitting an acoustic signal to a remote receiver. Depending on the frequency of the acoustic signal, a clock oscillator is enabled and provides a pulse train to an UP/DOWN counter. The counter can be made to count either up or down, again depending on the frequency of the acoustic signal. The counter output is coupled to a digital-to-analog (D/A) converter which develops an analog DC signal used to establish the gain of the amplifier.

Conventional DC gain-controlled circuits tend to have an S-shaped characteristic. That is, in order to cause a given change in gain, greater increments in control signal are required at the extremities of the gain-control range than are required over the central portion. As a result, the operator of a remote transmitter tends to feel a loss of control or an excessive time lag between the activation of the transmitter and a noticeable change in audio volume, at both the minimum and maximum levels of volume.

OBJECTS OF THE INVENTION

Accordingly, it is the object of this invention to implement a digital gain control system that provides the operator with a sense of continuous control over the entire range of operation.

It is a further object of this invention to provide a digital gain control system that assures a muted condition of the audio amplifier in the initial state of the counter and at least a minimum discernible amount of audio in the state immediately subsequent to the initial state.

SUMMARY OF THE INVENTION

These and other objects, advantages, and capabilities are achieved in a digital gain control system having an N-stage counter and a D/A converter coupled to the counter for developing an analog signal in response to the output of the counter and a control signal developing means coupled to the D/A converter for developing a control signal whereby the gain of a gain-controllable amplifier is varied in response to the output of the D/A converter in one aspect of the invention by a preadjusting means coupled to the D/A converter and the control signal developing means for effecting an initial increment in the control signal that is greater than the subsequent increments.

DESCRIPTION OF THE PREFERRED EMBODIMENT

For a better understanding of the present invention, together with other and further objects, advantages and capabilities thereof, reference is made to the following disclosure and appended claims in connection with the above description of some of the aspects of the invention.

Figure 1:
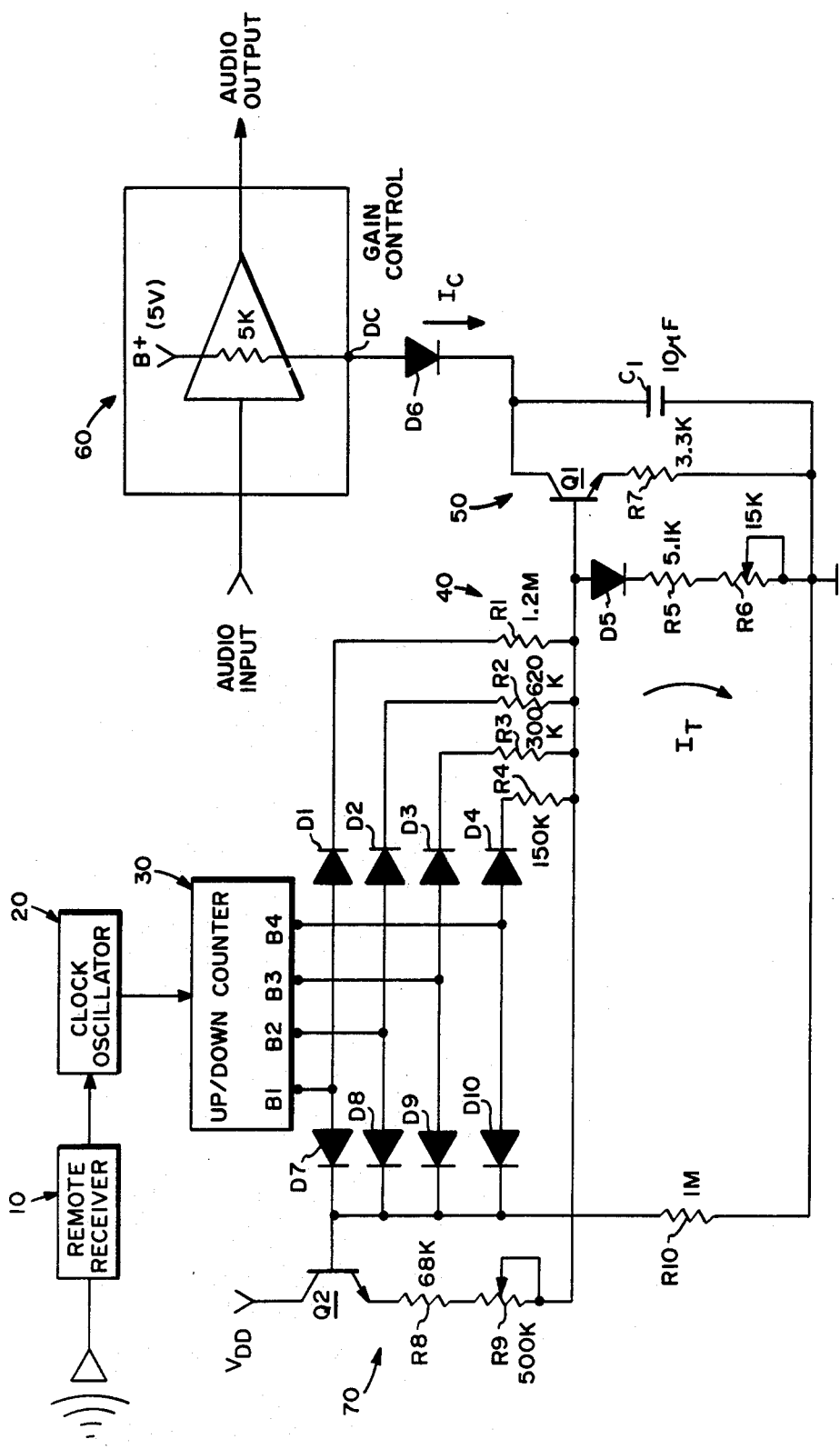
FIG. 1 is a schematic diagram of a particular embodiment of the subject invention. Conventional co-operating circuitry is shown in block form.

As shown in FIG. 1, a remote receiver 10 receives a signal from a remote transmitter (not shown). In practice, this signal may be an acoustical signal within the frequency range of aporoximately 34 KHz to 44 KHz. Upon reception of signals having sufficient amplitude and the appropriate frequency, a clock oscillator 20 is enabled, thereby providing a series of pulses to an UP/DOWN Counter 30. Depending on the frequency of the input signal, the counter will count either up or down from its original state and, in so doing, cause an increase or decrease in audio volume. The output of the counter consists of four binary outputs, $B_1$, $B_2$, $B_3$, and $B_4$, increasing in order from least-significant digit to a most-significant digit.

The output of an N-bit counter can assume any one of $2^N$ output states. For a 4-bit counter as shown here, the sixteen output states are designated, in order, 0000, 0001, 0010, ..., 1110, 1111.

The output of the counter is coupled to a digital to analog (D/A) converter 40 comprising diodes D1, D2, D3, and D4, each having an anode connected to one of the counter's binary outputs and a cathode respectively connected to one end of a current-weighting resistor, either R1, R2, R3, or R4. The other ends of the current weighting resistors are connected to a summing junction at the anode of a diode, D5. D5 has a cathode coupled through a series-connected fixed resistor R5 and a variable resistor R6 to circuit ground.

The counter and D/A converter operate to develop a voltage at the summing junction in proportion to the counter's output. For simplicity, assume that each of the counters binary digits has a logic level ONE output of $V_o$ volts and a logic level ZERO output of zero volts. The current-weighting resistors are chosen so that $R1=2\times R2,=4\times R3,=8\times R4$. Accordingly, when $B_1$ assumes a logic level ONE, it will contribute a current $I_1$, into the summing junction. If $V_o=13.8$ volts and $R1=1.2$ Megohms, it can be shown that $I_1$ will be equal to approximately 10 microamperes ($\mu A$). Similarly, when B2, B3, and B4 assume logical ONE levels, they will contribute a current $I_2=20$ $\mu A$, $I_3=40$ $\mu A$, and $I_4=80$ $\mu A$, respectively, Therefore, for a counter output state designated 0101, that is, $B_4=ZERO$, $B_3=ONE$, $B_2=ZERO$, and $B_1=ONE$, a total current, $I_T$, provided by the counter through the D/A converter, into the summing junction will be equal to 50 $\mu A$. It will develop a voltage, $V_T$, across the series-connected combination of D5, R5, and R6.

The voltage $V_T$ is coupled to a control signal developing means 50 comprising a transistor Q1 having a base connected to the summing junction and an emitter coupled through a resistor R7 to circuit ground. Q1 has a collector coupled through a diode D6 to the DC gain control terminal of a variable-gain audio amplifier 60. With regard to interface between the audio amplifier and the gain control developing means, the amplifiers gain-control circuitry may be represented as a 5 Kilohm (K) resistor connected between the amplifier gain control input and a 5-volt source of potential, B+.

Figure 2:
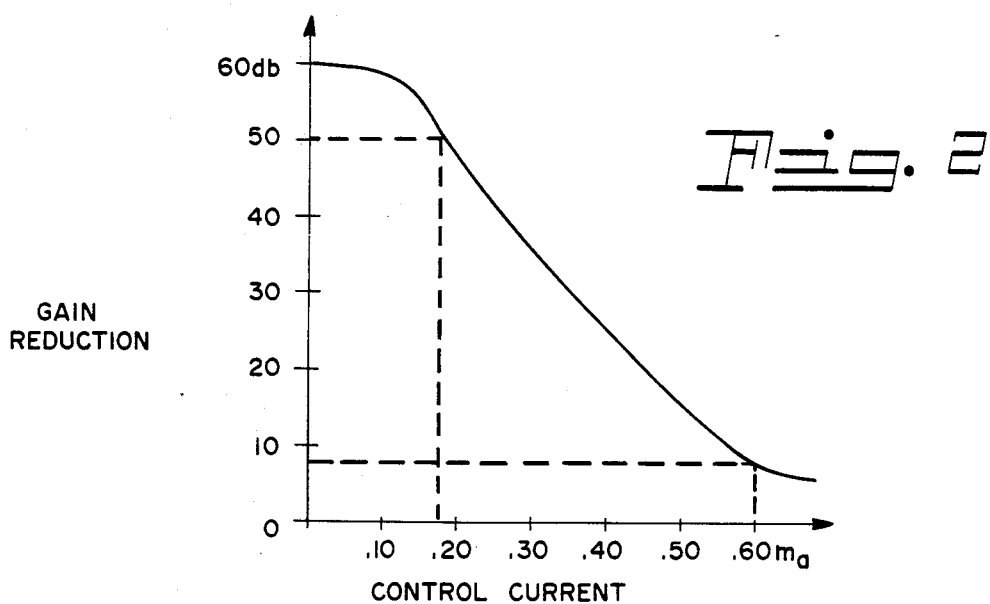
FIG. 2 is a graphical representation of the gain-control characteristics of a typical DC gain-controlled amplifier.

FIG. 2 shows a typical gain control characteristic of DC-controlled amplifiers. Note the nonlinear relationship between the amplifier gain and the control current, $I_c$, out of the DC gain control terminal. The amplifier gain can be varied a total of approximately 60 decibels (db) by varying the control current through a range of 0.65 milliamperes (ma). Conventionally, a 4-digit counter would divide the total 0.65 ma range into fifteen 0.045 ma increments. A binary count of 0000 would correspond to 0 ma control current, 0001 to 0.045 ma, 0010 to 0.09 ma, . . . , and 1111 to 0.675 ma. However, note that to vary the amplifier's gain from 60 to 50 db gain reduction (i.e., increase the amplifier gain by 10 db), requires approximately 0.18 ma control current. In a conventional digital gain control circuit, this requires the first four counts of a sixteen-step counter. A similar phenomena occurs at the highest 10 db the amplifier's range. As a practical matter, the operator of the remote transmitter will sense a loss of control or an additional time delay near minimum and maximum levels of volume. That is, even though the UP/DOWN volume control is activated, there is relatively little apparent change in audible volume. Conversely, during the middle range of control, say from 0100 (4) through 1011 (11), the apparent change may be uncomfortably abrupt. By developing an initial increment in the control current, from state 0000 to state 0001, that is larger than the remaining fourteen and by limiting the maximum range through which the amplifier's gain can be varied, the digital gain control system described herein circumvents such effects.

The initial greater increment in control signal is provided by a pre-adjusting means 70 comprising a transistor Q2 which has an emitter coupled through a fixed resistor R8 and a variable resistor R9 to the summing junction of the D/A converter. Q2 also has a base respectively connected through diodes D7, D8, D9, and D10 to the B1, B2, B3, and B4 outputs of the counter and a collector connected to a source of potential, $V_{DD}$. The base of Q2, that is, the junction of D7–D10, is coupled through a resistor R10 to circuit ground.

In any state of the counter other than the initial or ZEROth state 0000, a voltage of $V_o$ will be present at one or more of the anodes of D7–D10. As a result, a voltage of $V_o - V_{BE}$ will appear at the base of Q2. Q2 will be conducting and will provide an additional current to the summing junction of the D/A converter. This results in an additional voltage at the summing junction approximately equal to $$\frac{(V_o - 2V_{BE})(R5 + R6)}{R5 + R6 + R8 + R9}$$

By appropriately adjusting R9, the voltage at the summing junction can be made to change from 0 volts in the 0000 (or ZEROth) state, to the desired subsequent value in the 0001 state. In conjunction with automatic volume control circuits, this allows the circuit to guarantee a muted condition in the 0000 state and the minimum audible condition in the 0001 state.

For a particular IC audio amplifier having the gain control characteristic depicted in FIG. 2, R9 was adjusted to establish, in the 0001 state, a voltage of 1.2 volts at the summing junction, thereby providing an initial value of $I_T$ equal to 60 $\mu$A, thereby resulting in an initial value of control current, $I_c$, equal to 0.18 ma. Each additional count of the counter then results in an incremental change in $I_T$, $\Delta I_T$, equal to approximately $$\frac{V_o - V_{BE} - 1.2V}{R_1} = 10 \text{ microamperes.}$$

For simplicity, assume that R6 has been adjusted so that (R5+R6)=3 R7. In this instance each incremental change in $I_T$, $\Delta I_T$, will result in an incremental change in control current, $\Delta I_c$, that is equal to $3 \times \Delta I_T$ or 30 $\mu$A. It follows that the incremental change in the DC gain control voltage is (5K) (30 $\mu$a)=150 mv. Capacitor C1, connected between the collector of Q1 and circuit ground, tends to smooth out the otherwise stair-step waveform of $I_c$, thereby effecting a more linear change in audio volume and avoiding possible transient effects.

A significant aspect of the circuit is that the pre-adjusting means provides an initial value of $I_T$, which, in this embodiment, three times greater than the incremental current provided by the second-least-significant digit, that is, three times greater than the current corresponding to the counter state 0010, 20 $\mu$A. The reason is that an alternate method of providing an initial greater increment in $I_T$ would be to make the incremental current contributed by the least-significant digit greater than 10 $\mu$A. However, for values up to the value of current provided by the second-least-significant digit, 20 $\mu$A in this embodiment, the subsequent increments in the D/A output become unequal; that is, $\Delta I_T$ will be different depending on the counter's original output state prior to the increment. Furthermore, in the event initial increment in $I_T$ is made greater than 20 $\mu$A, the output of the D/A ceases to be a monotonic function of the counter's state. That is, the D/A output will be greater in the 0011 state than in the 0100 state, greater in the 0101 state than in the 0110 state, and so on. Clearly, this will result in a control signal that varies in an undesirable manner.

An additional feature of the digital gain control circuitry shown in FIG. 1 is that the maximum audio volume can be adjusted by varying R9 so as to establish and adjust the magnitude of the subsequent increments and thereby limit the maximum voltage appearing at the base of Q1. This limits the maximum amount of control current developed by Q1 and the maximum gain of the audio IC. For an audio IC having the characteristics of FIG. 2, it may be desirable to adjust R9 so that $I_c$ is limited to a value less than or equal to approximately 0.60 ma. This will provide more than adequate audio volume and will additionally assure that the IC is operating over the linear portion of its gain control characteristic for all output states of the counter. Table 1 (below) indicates theoretical values of the control current, $I_c$, and the control voltage, $V_c$, as they exist for given states of the counter in a digital gain control circuit as descibed above. Some of the salient features of the circuit inherent in these values are: (1) in the ZEROth state of the counter, $I_c$ is equal to 0 ma, the amplifier gain is 0, and the audio output is muted; (2) in the 0001 state of the counter, R9 has been adjusted so as to develop a control current corresponding to the minimum discernible audio volume; (3) R6 has been adjusted to provide the desired maximum audio volume and; preferably, to confine the control of the audio IC to the linear portion of its characteristics.

TABLE 1

| Counter Output | Control Current $I_c$ | Control Voltage $V_c$ |
| --- | --- | --- |
| 0000 | 0 ma | 5.0 V |
| 0001 | 0.18 | 4.1 |

TABLE 1-continued

| Counter Output | Control Current $I_c$ | Control Voltage $V_c$ |
|---|---|---|
| 0010 | 0.21 | 3.95 |
| 0011 | 0.24 | 3.80 |
| 0100 | 0.27 | 3.65 |
| 0101 | 0.30 | 3.50 |
| 0110 | 0.33 | 3.35 |
| 0111 | 0.36 | 3.20 |
| 1000 | 0.39 | 3.05 |
| 1001 | 0.42 | 2.90 |
| 1010 | 0.45 | 2.75 |
| 1011 | 0.48 | 2.60 |
| 1100 | 0.51 | 2.45 |
| 1101 | 0.54 | 2.30 |
| 1110 | 0.57 | 2.15 |
| 1111 | 0.60 | 2.00 |

Figure 3:
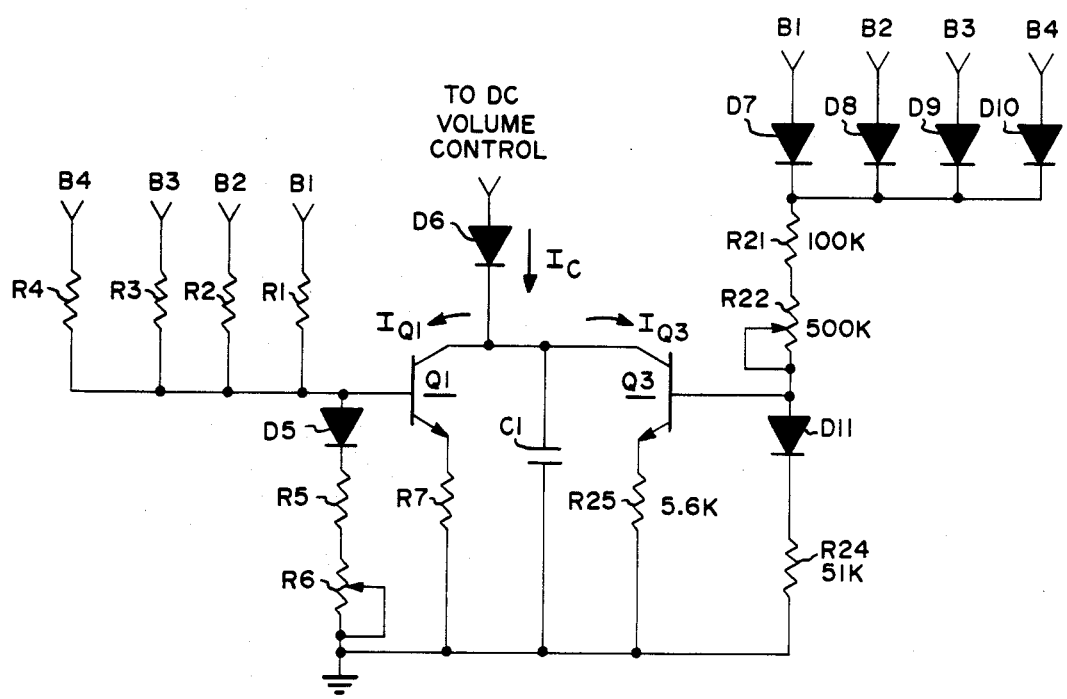
FIG. 3 is a schematic diagram of an alternate embodiment of the instant invention.

FIG. 3 illustrates an alternate embodiment of the preadjusting means 70. The alternate embodiment comprises a transistor Q3 having a base coupled through a fixed resistor R21 and a variable resistor R22 to diodes D7, D8, D9, and D10 and through the diodes to the outputs of the counter. Q3 also has a collector connected to the collector of Q1 and emitter coupled through a resistor R25 to circuit ground. In a manner similar to that described above Q3 will operate to provide an initial increment in the control signal that will be greater than the remaining $2^N-2$ increments. As before, whenever the counter is in a state other than the ZEROth state, a voltage approximately equal to $V_o-V_{BE}$ will be present at the junction of diodes D7–D10. As a result a voltage $(V_{BQ3}+V_{BE})$ will appear at the base of Q3, $$V_{BQ3} = \frac{(V_o - 2V_{BE})(R24)}{R21 + R22 + R24}.$$

Accordingly Q3 will conduct a collector current equal to $V_{BQ3}/R25$ and this current will be added to the collector current of Q1 to develop the total control current, $I_c$, at the DC control terminal of the audio amplifier.

Although the digital gain control circuitry has been described in connection with an audio IC whose gain is controlled by a DC current, the invention clearly contemplates the use of circuits whose gain is controlled by a DC voltage. As a matter of fact, the table above indicates the values of DC gain control voltages corresponding to particular values of $I_c$. In such circuits it may be desireable to buffer the output of Q1 through, say, an emitter-follower thereby providing a low-impedance source at the DC gain control terminal.

Furthermore, although an audio amplifier has been assumed for purposes of description, the invention disclosed herein is clearly not limited to audio circuitry but has utility with other gain-controlled circuitry, such as automatic video or chrominance processors that may also be found in television systems, or circuitry not at all endemic to television receivers.

Accordingly, while there has been shown and described what are at present considered the preferred embodiments of the invention, it will be obvious to those skilled in the art that various changes and modifications may be made therein without departing from the scope of the invvention as defined by the appended claims.

What is claimed is:

1. A digital gain control system for controlling the gain of a gain-controllable amplifier, the system comprising: an oscillator;
   an N-stage counter having an input coupled to the counter of the oscillator whereby $2^N$ digital counter output states are developed in response to the output of the oscillator;
   a D/A converter coupled to the counter for developing an analog signal of $2^N-1$ increments in response to the digital output states of the counter;
   control signal developing means having an input coupled to the output of the D/A converter and an output coupled to the amplifier, said means responsive to the output of the D/A converter so that its output, and hence the gain of the amplifier, vary in response to the output of the D/A converter;
   pre-adjusting means having an input coupled to the output counter and an output coupled to the control signal developing means, said means for supplementing the output of the D/A converter in response to the counter output so that the magnitude of the initial increment in control signal as the counter goes from the ZEROth state to the state immediately subsequent is greater than the subsequent $2^N-2$ increments.

2. A system as defined in claim 1 wherein the preadjusting means comprises a semiconductor device coupled to the counter so that the device is nonconductive in the ZEROth state and conductive in other states.

3. A system as defined in claim 2 wherein the preadjusting means further comprises a resistor coupled between the semiconductor device and the input of the control signal developing means for establishing the initial increment at a desired level.

4. A system as defined in claim 3 further comprising means for adjusting the magnitude of the subsequent $2^N-2$ increments.

5. A system as defined in claim 4 wherein the semiconductor device is a transistor having a base coupled through N diodes to the N outputs of the counter whereby the transistor is rendered conductive in all but the ZEROth state of the counter.

6. A digital gain control system as defined in claim 2 or claim 5 further comprising a summing junction between the D/A converter and the control signal developing means, the summing junction coupled through a resistance to ground whereby a voltage is developed at the summing junction in response to the current flowing through the resistance, said voltage determinative of the output of the control signal developing means.

7. A digital gain control system as defined in claim 6 wherein the summing junction is coupled through a first variable resistor to circuit ground and the control signal developing means comprises a first electrode connected to the summing junction, a second electrode coupled through a resistor to ground, and a third electrode coupled to a gain control terminal of the gain-controllable circuit, whereby the gain of the gain-controllable circuit varies in response to a control current flowing between the gain control terminal and the third electrode of the control signal developing means.

8. A digital gain control system as defined in claim 5 further comprising a summing junction between the D/A converter and the control signal developing means, the summing junction coupled through a resistance to ground whereby a voltage is developed at the summing junction in response to the current flowing through the resistance, said voltage determinative of the output of the control signal developing means.

9. A digital gain control system as defined in claim 8 wherein the transistor of the pre-adjusting means has an emitter coupled through a variable resistor to the control signal developing means, whereby the voltage at the summing junction is determined by the output current of the D/A converter and the emitter current of said transistor and whereby the control current is substantially zero in the ZEROth state of the counter and the initial increment of the control current is determined by said emitter current.

10. A system as defined in claim 2 wherein the semiconductor device has an output coupled to the output of the control signal developing means and an input coupled through a resistance and N diodes to the N outputs of the counter.

11. A system as defined in claim 10 wherein the semiconductor device is a transistor having a base coupled to the resistances and the N diodes so that in all but the ZEROth state of the counter the transistor output current is added to an output current developed by the control signal developing means whereby the initial incremental change in gain of the amplifier, as the counter goes from the ZEROth state to the state immediately subsequent, is greater than the subsequent $2^N-2$ incremental changes in gain.

12. A system as defined in claim 11 wherein the transistor has a collector coupled to the output of the control signal developing means and the resistance comprises a variable resistor for establishing the initial increment in control signal.

13. In a digital gain control system having an oscillator-driven N-stage counter which in turn drives a D/A converter whose analog output is coupled to control signal developing means for controlling the gain of a gain-controllable amplifier, the improvement comprising pre-adjusting means having an input coupled to the output of the counter and an output coupled to the output of the D/A converter for supplementing the output of the D/A converter in response to the counter output so that the magnitude of the initial increment in the control signal as the counter goes from the ZEROth state to the state immediately subsequent is greater than the subsequent $2^N-2$ increments.

14. An improvement as defined in claim 13 wherein the pre-adjusting means comprises a semiconductor device having an input coupled through N didoes to the N outputs of the counter so that the device is in one state of conduction during the ZEROth state of the counter and in the opposite state of conduction during other states of the counter.

15. An improvement as defined in claim 14 wherein the output of the pre-adjusting means is coupled to the input of the control signal developing means.

16. An improvement as defined in claim 14 wherein the output of the pre-adjusting means is coupled to the output of the control signal developing means.

* * * * *

UNITED STATES PATENT AND TRADEMARK OFFICE
CERTIFICATE OF CORRECTION

PATENT NO. : 4,151,481
DATED      : April 24, 1979
INVENTOR(S) : David Lee Funston and Zachariah Harrison Milburn, Jr.

It is certified that error appears in the above-identified patent and that said Letters Patent are hereby corrected as shown below:

Column 2, line 13: "aporoximately" should read --- approximately ---

Column 6, Claim 1, line 5: "counter of" should read --- output of ---

Signed and Sealed this

Thirty-first Day of July 1979

[SEAL]

Attest:

LUTRELLE F. PARKER
Attesting Officer   Acting Commissioner of Patents and Trademarks